United States Patent
Shahinpoor et al.

(10) Patent No.: US 6,829,499 B1
(45) Date of Patent: Dec. 7, 2004

(54) BIO-ELECTRIC SENSOR AND SWITCH SYSTEM FOR MEDICAL IMAGING

(76) Inventors: Mohsen Shahinpoor, 9910 Tanoan Dr. NE., Albuquerque, NM (US) 87111; Sorin Gabriel Popa, 10734 Stone Hedge Ct. NW., Albuquerque, NM (US) 87114

(*) Notice: Subject to any disclaimer, the term of this patent is extended or adjusted under 35 U.S.C. 154(b) by 783 days.

(21) Appl. No.: 09/681,130

(22) Filed: Jan. 17, 2001

(51) Int. Cl.[7] ................................................ A61B 5/05
(52) U.S. Cl. ........................................................ 600/407
(58) Field of Search ................... 600/407–482, 600/595, 300; 307/38, 140; 446/175; 250/206, 208.2; 219/109, 110; 340/447, 870.02; 367/7, 11, 94, 130, 138; 73/620–633; 310/300; 128/916

(56) References Cited

U.S. PATENT DOCUMENTS

| | | | | |
|---|---|---|---|---|
| 4,353,375 A | * | 10/1982 | Colburn et al. | 600/595 |
| 4,360,905 A | * | 11/1982 | Hackett | 367/94 |
| 4,672,166 A | * | 6/1987 | Ladeburg et al. | 219/110 |
| 4,712,607 A | * | 12/1987 | Lindemans et al. | 165/263 |
| 4,963,807 A | * | 10/1990 | Wendling | 318/632 |
| 5,056,049 A | * | 10/1991 | O'Neill | 702/55 |

* cited by examiner

Primary Examiner—Ali Imam (57) ABSTRACT

The present invention relates to an electronic device, which can be triggered by the proximity of bioelectric fields, or by the motion of charges and ions. The triggered element of the device can be controlled between the two states: on and off. From this point of view it can be considered a switch. However, the triggered element can also attain all the intermediate states between the on and off states, according to the intensity of the external stimuli. From this point of view it can be considered a sensor, since its response is directly related to the sensed stimulus.

9 Claims, 6 Drawing Sheets

BIO-ELECTRIC SENSOR AND SWITCH SYSTEM FOR MEDICAL IMAGING

BACKGROUND OF INVENTION

1. Field of the Invention (Technical Field)

The present invention relates to the field of charge and ion sensors and interactive switches, with the capability to be dynamically, real-time triggered by the proximity of biological entities or by the motion of charges and ions. This invention focuses on its applications in medical imaging. It also involves the relation between field (charge) intensity and the distance between the source and device, which can be calibrated by considering the distance at which the device turns completely on or off.

2. Background Art

It is appropriate to mention some related prior art: Huang and Kunzler in U.S. Pat. No. 5,575,557, issued November 1996 discuss a Motion sensor light apparatus in which a motion sensor light apparatus comprises a lighting body, a mounting base for mounting the lighting body to a wall. The base body has an azimuthal aperture and installs therein a lens, a seat, and a motion sensor circuit board mounted on the seat. The seat has an azimuthal seat aperture superimposing to the aperture of the base body. A lens is adhered to the seat and positioned between the seat aperture and the aperture of the base body, and directs infrared radiation from a human or vehicle object to an infra-red sensor of the motion sensor circuit board. Based on the above description it can be observed that this device uses a concept different than the one used in the present invention in the sense that its sensing device is an infrared sensor, which is triggered through a lens.

Branson in U.S. Pat. No. 5,993,397, issued November 1996 discusses an infant respiratory monitor for alerting the supervisors of an infant when there is a lack of movement of the infant due to respiratory problems. The device comprises a housing having an attachment for clip for securing the housing to an infant. Respiratory monitoring circuitry is contained within the housing, and comprises a power source, which is in circuit with a motion sensor, processor and audio output means. The motion sensor detects movement, and transmits the presence of such movement to the processor. Because this device uses an infrared motion sensor, it cannot offer real-time switching on/off, which makes it different than the concept applied in the present invention.

Zangrando in U.S. Pat. No. 4,112,267, issued September 1978 discusses a coded switching device having a plurality of actuator dial knobs will, n set to a predetermined combination, provide electrical continuity between terminals on the device. Setting the dial knobs to another predetermined combination will enable the combination to be changed. The device consists of a number of stations, each comprising an actuator, a switch, and a detent mechanism, equal to the number of digits desired in the combination. Compared with the present invention, the one described above involves a mechanical switching assembly. This makes it different than the present invention, which uses an electronic switching system that is biologically and ionic triggered.

Somner and Harvey in U.S. Pat. No. 5,819,124, issued October 1998 discuss a security system that includes a camera connected to a motion sensor for detecting motion in the vicinity of the camera. The system has a stand-by state in which the motion sensor is active and a ready state wherein triggering of the motion sensor again causes the camera to capture an image. Since this security system uses infrared motion detectors, it is different than the one of the current invention.

Kramer in U.S. Pat. No. 5,998,780, issued December 1999 discusses an algorithm and circuits for sensing a moving optical stimulus. Three sequentially produced electrical signals at different locations in response to a moving stimulus are used to generate a monotonic function of velocity which is substantially insensitive to the global illumination level and stimulus contrast. This device differs from the one of the present invention in the sense that the latest one uses a set of switches that is biologically and ionic triggered.

Junkert and Voznick in U.S. Pat. No. 4,456,390, issued June 1984 discuss a portable, battery operated noncontact temperature measuring device including a lens for collecting infrared radiation and a thermopile for producing a signal indicative of the intensity thereof. This is mainly a thermal-optical device and therefore it is different than the one proposed in the current invention.

Naka and Watanabe in U.S. Pat. No. 5,225,695, issued July 1993 discuss a solid-state imaging device provided with a CCD-structured branching unit. This selects one signal charge sensor having characteristics suitable for the conditions of use from among a plurality of signal charge sensors each having different characteristics and forms a signal charge transmission path leading from the horizontal CCD to the selected signal charge sensor. This device differs from the current invention in the sense that it detects only a limited range on charge characteristics, while the current invention covers a broader range and visualization is done directly, with no additional processing.

Pelgrom in EP patent 155023, issued September 1985 discusses a charge sensor, more particularly for a charge transfer device, comprising two cross-coupled MOS transistors, two load MOS transistors, a positive and a negative current supply, and other two MOS transistors. The circuit arrangement is suitable for reading information in a CCD storage, in which the digital information can be applied to one input gate and a reference level halfway between the 0 level and the 1 level can be applied to the other input gate. Even if this circuit is a charge sensor, it differs from the current invention since it involves a different concept and a completely different electronic configuration.

Toolan in U.S. Pat. No. 4,386,834, issued July 1983 discusses a battery-powered corona discharge photography device for holding a photographic recording medium adjacent an electrode, with a specimen in contact with the recording medium. The Kirlian photography senses and visualizes a biological field, which is comparable with the one sensed by the current invention. However, the sensing principle is completely different and the range of sensing differs considerably, since the invented device has an adjustable sensing range.

Mandel in U.S. Pat. No. 4,222,658, issued September 1980 discusses a device for use in connection with Kirlian photography. This includes a seat insulated with regard to a support for the seat, a foot rest insulated relative to a support therefor, a bottom electrode arranged in spaced relationship to and ahead of the foot rest and insulated with regard to a support for the foot rest. The device, furthermore, comprises a plate arranged above the bottom electrode and insulated with regard to the bottom electrode and the support the plate electrode, the bottom electrode and the plate electrode being respectively connected to the poles of a high frequency generator. This device differs from the invented one in the sense of the concept of sensing and through it complexity of materials used.

Hirschowitz and Li in U.S. Pat. No. 4,328,809, issued May 1982 discuss a device and method for detecting the potential level of the electromagnetic field present between a reference point and a test point of a living organism. A reference electrode provides a first signal indicative of the potential level of the electromagnetic field at the reference point. A test electrode provides a second signal indicative of the potential level of the electromagnetic field at the test point. This device differs from the invented one in the sense that it involves electrodes, which represents practically a completely different method.

Everett and Schlenz in U.S. Pat. No. 3,568,662, issued March 1971 discuss a method and apparatus for sensing bioelectric potentials utilizing a passive, capacitive coupling to the body and establishment by such capacitive coupling of an electrical signal representative of the body potential at the site of such capacitive coupling. Even if the results are comparable with the ones of the present invention, the method involved is different since it is based on capacitive coupling while the present invention is based on switching triggered by biological or ionic signals.

Schmidt in U.S. Pat. No. 5,790,032, issued August 1998 discusses an apparatus for detecting the presence of living bodies by means of electromagnetic signals and a receiver device for receiving electromagnetic signals. The receiver device for receiving electromagnetic signals includes a device for obtaining frequency components which are characteristic in respect of living bodies, out of the received electromagnetic signals, characterized in that the receiver device includes a direct demodulator that demodulates the received signals to obtain said frequency components. This device differs from the invented one in the sense that it focuses manly on finding hidden living bodies and the method involves a demodulator to separate the frequencies.

Therefore it appears that based on the prior art just reported there are not any similar devices existing in the world.

SUMMARY OF INVENTION

The present invention relates to an electronic device that acts as both a sensor and a variable intensity switch, which can be triggered by the proximity of biological entities, or by the motion of charges and ions and assembly of charges and ions such as dipoles.

An object of the present invention is to provide the ability to sense in real-time the proximity of biological entities and to react accordingly. Thus, various other devices could be triggered, as for example turning a light on and off but also dimming it, switching on and off a musical device, moving various parts according to the proximity and intensity of the biologically triggered signals. These biologically triggered signals emanate from biological movements. Even stationary biological systems involved in intensive neurological activities can be sensed by the said invention by detecting the presence and movement of neural signals or the initiation of action potential associated with biological systems. Thus, the present invention in a distributed multi-sensor configuration can be used to map out the entire electrical and neurological activities of a biological system. In this configuration, the present invention can be also considered a neurosignal imaging (NSI) device.

Another object of the present invention is to enhance the medical diagnosis process by providing the medical doctors computer software and hardware for visualizing the electric activity of the human body. For this, the triggered signal can be captured by a data acquisition board and sent to a computer. With the proper software, the effects of the external signals can be visualized and processed. The result of this visualization can lead to the mapping of the electrical activity of the human body.

Another object of the invention is to use its capability of visualizing the electrical activity of the human body in order to monitor the evolution of certain conditions or physiological processes. Thus, it represents a valuable add-on or standalone device for medical imaging.

Another object of the invention is to contain a specific contact configuration that allows the current to pass or not to pass, according to the influence of the external stimuli of the biological entities or of the motion of charges and ions.

Yet another object of the invention is to have the capability to differentiate (based on the contact configuration) between positive and negative charges and ions and between positive charged fields and negative charged fields.

Another object of the invention is to provide an interactive device to be incorporated in toys and to react according to the proximity of various biological entities.

Another object of the invention is to provide an add-on for security systems, which will allow sensing of biological entities behind various obstacles (e.g. regular thickness walls, windows, etc.

Another object of the invention is to provide a tool for adjusting the range of sensing and switching described above. The adjusting is both qualitative and quantitative. Modifying the contact configuration does the qualitative adjustment and modifying the input voltage does the quantitative adjustment.

Another object of the invention is to provide a device for monitoring various animals or moving entities within a predetermined area.

An advantage of the invention is the fact that it can perform medical noninvasive investigation with a high degree of accuracy.

Another advantage of the invention is the fact that it enhances the range of sensing of current security systems.

Another advantage of the invention is the fact that it provides the possibility of manufacturing truly interactive toys, i.e. which do not need to be preprogrammed.

Another advantage of the invention is the fact that it opens new perspectives towards understanding and using unconventional methods of diagnosis, control, etc., and in the meantime it gives a offers a better understanding of the human body.

BRIEF DESCRIPTION OF DRAWINGS

Reference is now made to the accompanying drawings in which like numerals represent like parts and in which.

DETAILED DESCRIPTION

Figure 1:
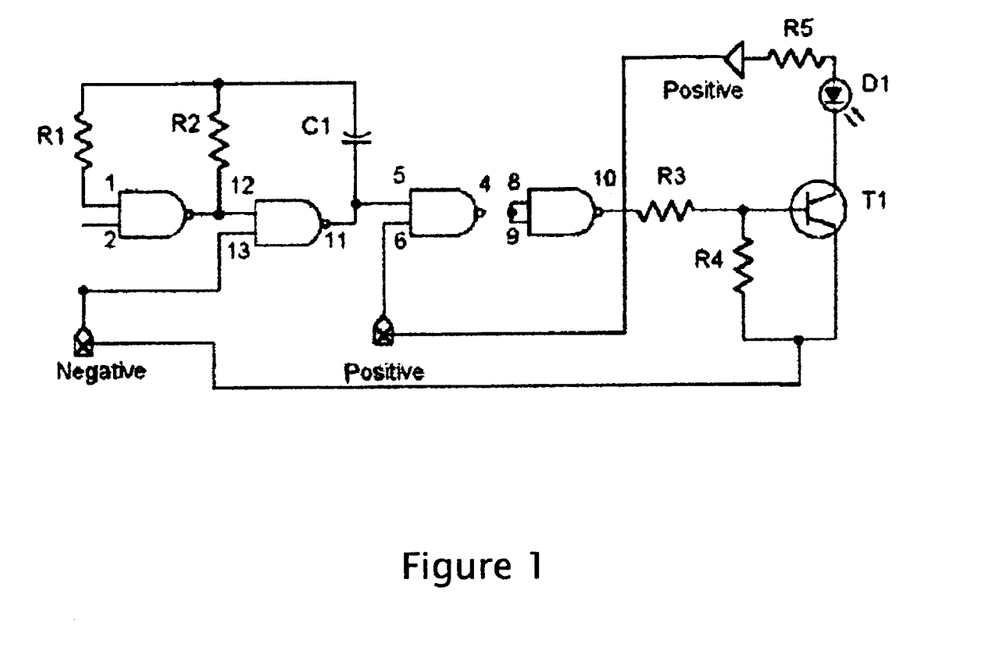
FIG. 1 is the scheme of the electronic circuit of the device, in accordance with an embodiment of the invention.

Referring to FIG. 1, which shows the scheme of the electronic circuit of the device, the following details are to be observed. The circuit is a modified NAND CMOS based transmitter, with the following pin contact descriptions:

Pin 1, to resistor R1 (220 kΩ), regular contact;
Pin 2, disconnected (i.e. no contact);
Pin 3, to resistor R2 (33 kΩ), regular contact;
Pin 4, disconnected (i.e. no contact);
Pin 5, disconnected (i.e. no contact);
Pin 6, to POSITIVE, imperfect contact (FIG. 7), in accordance with one of the embodiments of the invention;
Pin 7, disconnected (i.e. no contact);
Pin 8, to pin 9, regular contact;
Pin 9, to pin 8, regular contact;
Pin 10, to resistor R3 (3.9 kΩ), regular contact;
Pin 11, to capacitor C1 (0.01 µF), regular contact;
Pin 12, disconnected (i.e. no contact);
Pin 13, to NEGATIVE, imperfect contact (FIG. 7), in accordance with one of the embodiments of the invention;
Pin 14, disconnected (i.e. not connected).

Furthermore, pin 13 is connected to resistor R4 (33 kΩ) and to transistor Q1 (2N3904), and all three to the same NEGATIVE. Also, pin 6 is connected to resistor R4 (100 Ω) through the same POSITIVE.

Figure 6:
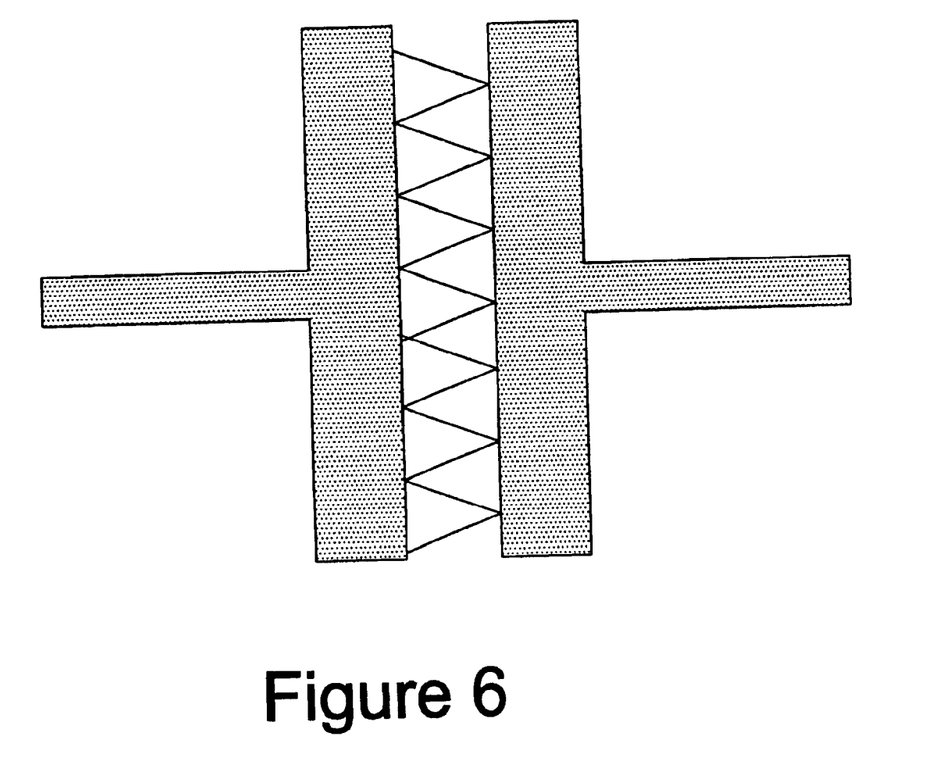
FIG. 6 shows a sketch of the pair of contacts, in accordance with an embodiment of the invention.

The imperfect connections on pin 6 and pin 13 represent the key object of the invention. Thus, both pin 6 and pin 13 are connected to POSITIVE and NEGATIVE respectively, through a pair of contacts with adjustable distance between them, as shown in FIG. 6. Through various combinations of distances between the two contacts of each pin, the circuit is made operational and the range of sensing/switching can be adjusted. This achievement is based on the high sensitivity of the NAND 4093 CMOS integrated circuit to external electrostatic influence. However, the invented circuit, based on the above presented contact configuration, offers a high sensitivity and switching capability to dynamic signals, which represents an improved behavior and a wider range of application.

Figure 2:
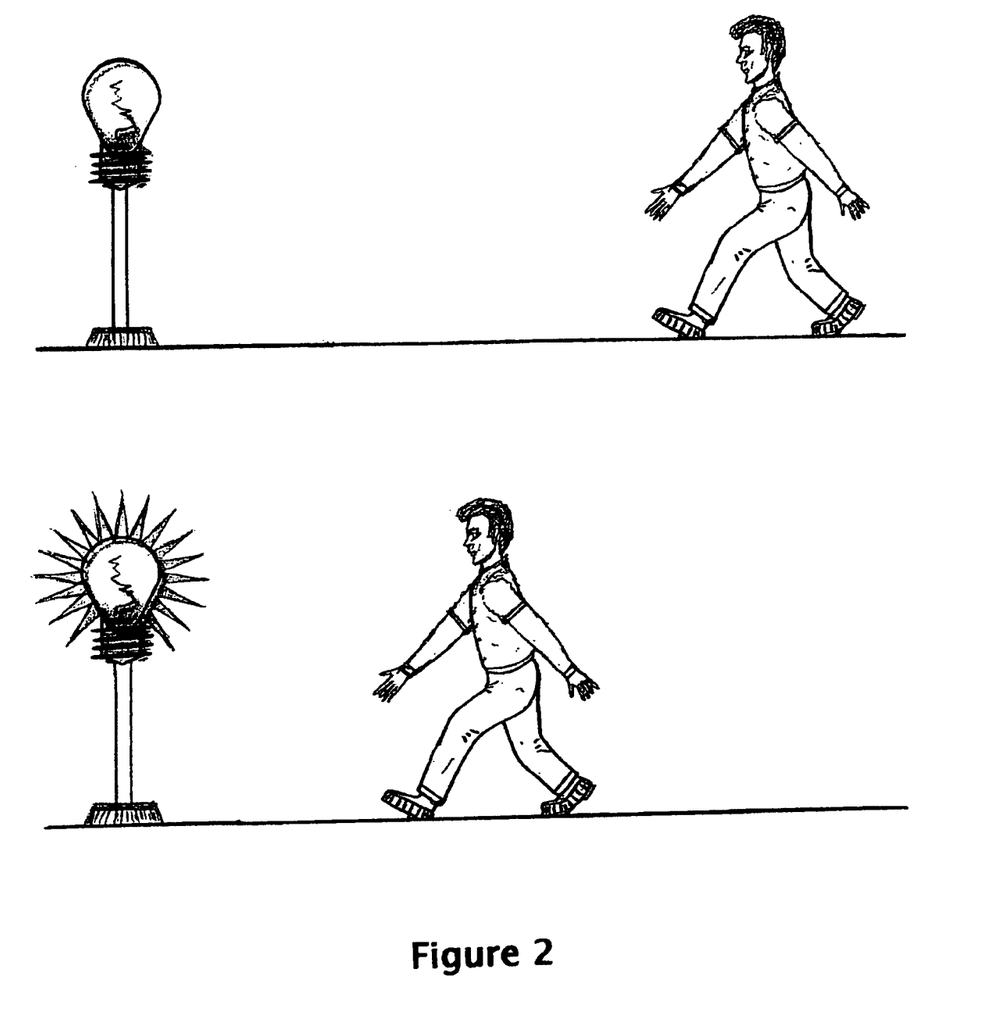
FIG. 2 shows the principle of sensing/switching of the invented product.

Referring to FIG. 2, which shows the basic principle of sensing/switching of the invented device, the following must be mentioned. The circuit originally is equipped with an LED in order to visualize the sensing/switching activity. Switching is observed by the fact that when a person comes closer to the circuit the LED changes its state (from on to off or from off to on). The difference in reaction is explained by the influence of positive or negative charges and ions i.e. one turns the circuit off when approaching the circuit, while the other turns it on. Also, it should be noted that the on/off switching works on a specific configuration of the contacts mentioned above.

Continuing the principle described by FIG. 2, on a specific configuration of contacts the circuit has a continuous response. Thus, according to an embodiment of the invention (considering the LED mentioned above), the following conclusion can be written. When a person is getting closer or farther from the circuit, the LED dims or becomes brighter, according to the type of charge (positive or negative) and to the direction of motion (towards the circuit or away from the circuit).

Figure 3:
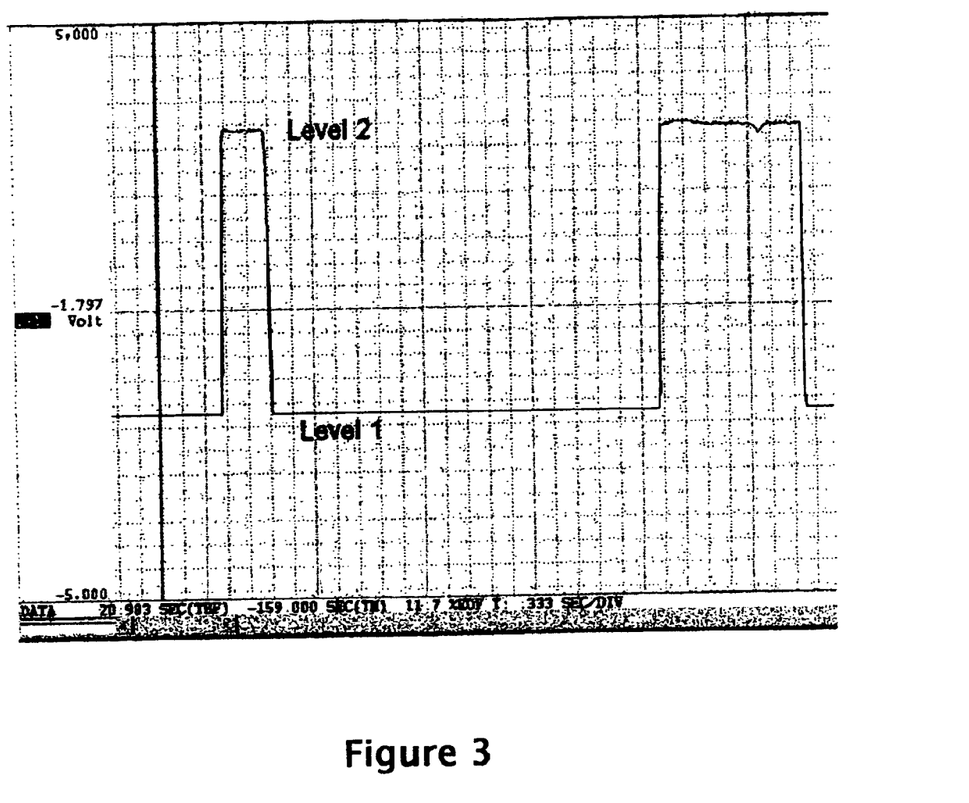
FIG. 3 shows a chart of the signal captured by a data acquisition device from the invented product, operating as a switch.
Figure 4:
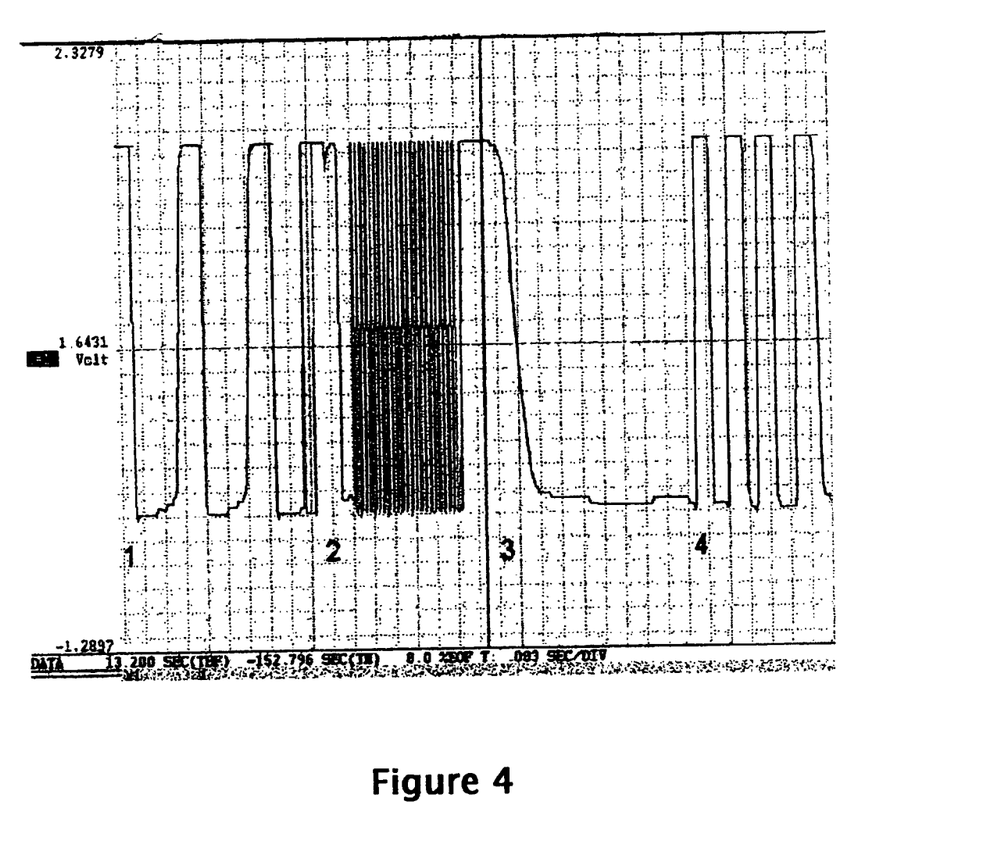
FIG. 4 shows a chart of the signal captured by a data acquisition device from the invented product, operating as a sensor.

Referring to FIGS. 3 and 4, which show a chart of the signal captured by a data acquisition device from the invented product, the following observations must be made. The data acquisition board is set to capture voltage signals from the two ends of the LED on the circuit. Here there are two situations: when the circuit is set to work as a switch and when the circuit is set to work as a sensor. In FIG. 3 is shown the chart obtained by processing the signal captured from a device working as a switch. Here it can be observed a signal of constant value (Level 1), which at a certain moment encounters a step distortion (Level 2) as a consequence of a human approaching the circuit.

On the other hand, in FIG. 4 is shown the chart obtained by processing the signal captured from a device working as a sensor. Here it can be observed that the signal has a continuously variable value, between two limits. In the absence of any external influence, there is a constant variation (between points 1 and 2). When a human approaches the circuit, clear deviations from the uniform variation are recorded. These distortions can be both in frequency (between points 2 and 3) and nominal value of the voltage (between points 3 and 4). These distortions can be then processed in order to describe accurately the relation to the proximity and the intensity of the captured external signal. After the external signal stops, the system gets back to its initial, constant variation (between points 4 and 5).

Figure 5:
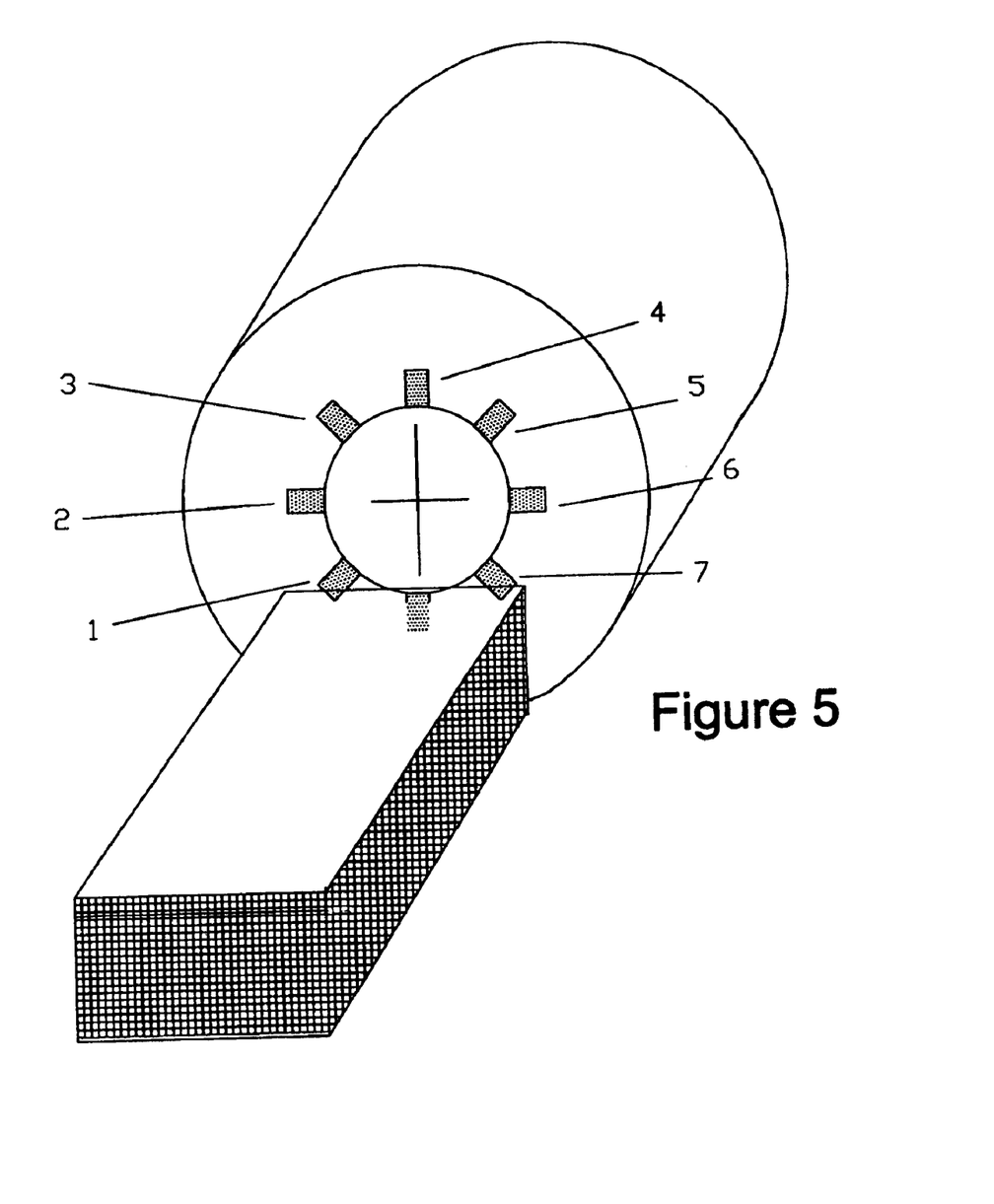
FIG. 5 depicts an assembly of sensors used for mapping the electric activity of the human body.

Referring to FIG. 5, which shows an assembly of sensors used for mapping the electric activity of the human body, the following observations must be made. In order to map the electrical activity of the human body, a system comparable with the one used in CAT scans is used. Thus, a person could lay down on a bed, which slides then through a donut shaped device that contains on its inner wall a set of sensors. The distance between each individual circuit and the person remains is computed during the procedure. Thus, the signals captured from each circuit by a data acquisition board are mainly based on the intensity of the external signal as a dynamic factor and on the distance to the circuit as a static factor.

These values are then processed for the mapping of the electrical activity of the body. Then, the obtained map is compared with a standardized one in order to observe irregularities. This procedure can be applied for both diagnostics and monitoring of the electrical activity (i.e. for monitoring the evolution of various conditions.

In FIG. 6 is presented a sketch of the pair of contacts that constitute the imperfect contact mentioned above. The two ends of the contact are practically not in direct contact, but in a partial contact, which enables the properties of the invented device.

What is claimed is:

1. An electronic circuit based on a NAND CMOS 4093 or similar CMOS integrated circuit, which is able to sense the electrical activity of biological entities and the motion of charge and ions, comprising:
   (a) aNAND CMOS 4093 integrated circuit or similar CMOS integrated circuits
   (b) one 220 kΩ resistor;
   (c) two 33 kΩ resistors;
   (d) one 3.9 kΩ resistor;
   (e) one 100 Ω resistor;
   (f) one 0.01 µF capacitor;
   (g) one 1.7 V output LED;
   (h) one or two potentiometers;
   (i) two adjustable switches.

2. The circuit contact configuration based on adjustable contacts used in the circuit of claim 1, further includes a contact configuration based on adjustable contacts, wherein a set of imperfect contacts in the form of a pair of, extremely close but not contacting, conductive surfaces is created and used.

3. The contact configuration in the circuit of claim 1 or 2 that allows the use of the circuit as a micro-switch.

4. The contact configuration in the circuit of said claim 1 or 2 that allows the use of the circuit as a sensor.

5. A set of circuits of claim 1 or 2 used to map out and electronically computer record the electrical activity of a human body, for diagnostics and for monitoring the state of health or the evolution of various healing, curing or medical conditions under doctor supervision.

6. An assembly of circuits of claim 1 or 2 arranged in such a configuration as to create an add-on or a standalone unit for medical imaging purposes.

7. A set of circuits of claim 1 or 2 used in toys to enable them to interact remotely with biological entities.

8. Said invention described in claim 1 or 2 used to enhance security systems by detecting biological movements behind ordinary walls or other comparable obstacles.

9. Said invention described in claim 1 or 2 used to interact with, detect and identifyany other electronic or moving charge systems or any living or non-living charge carrying material or non-material entity.

* * * * *